United States Patent
Kanamitsu et al.

(10) Patent No.: US 7,371,483 B2
(45) Date of Patent: May 13, 2008

(54) METHOD FOR MANUFACTURING MASK FOR FOCUS MONITORING, AND METHOD FOR MANUFACTURING SEMICONDUCTOR DEVICE

(75) Inventors: Shingo Kanamitsu, Kawasaki (JP); Takashi Hirano, Kawasaki (JP); Kyoko Izuha, Yokohama (JP); Soichi Inoue, Yokohama (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 676 days.

(21) Appl. No.: 10/830,399

(22) Filed: Apr. 23, 2004

(65) Prior Publication Data

US 2004/0265709 A1 Dec. 30, 2004

(30) Foreign Application Priority Data

Apr. 25, 2003 (JP) ............................. 2003-122339

(51) Int. Cl.
*G03F 9/00* (2006.01)
(52) U.S. Cl. .................... 430/5; 430/296; 430/942
(58) Field of Classification Search .................. 430/5, 430/296, 942
See application file for complete search history.

(56) References Cited

U.S. PATENT DOCUMENTS 6,440,616 B1 * 8/2002 Izuha et al. ..................... 430/5
7,094,504 B2 * 8/2006 Izuha et al. ..................... 430/5

FOREIGN PATENT DOCUMENTS

| JP | 07-056322 | 3/1995 |
| JP | 2001-100392 | 4/2001 |
| JP | 2001-343733 | 12/2001 |
| JP | 2002-299205 | 10/2002 |
| JP | 2002-311568 | 10/2002 |

OTHER PUBLICATIONS

Notification of Reasons for Rejection from Japanese Patent Office dated Feb. 7, 2006 in Japanese Application No. 2003-122339, and English translation thereof.
Izuha, K. et al., "Mask, Manufacturing Method for Mask, And Manufacturing Method for Semiconductor Device", U.S. Appl. No. 10/668,245, filed Sep. 24, 2003.

* cited by examiner

*Primary Examiner*—Christopher G. Young
(74) *Attorney, Agent, or Firm*—Finnegan, Henderson, Farabow, Garrett & Dunner, L.L.P.

(57) ABSTRACT

Disclosed is a method for manufacturing a mask for focus monitoring, comprising forming a first opening portion and a second opening portion in a surface region of a transparent substrate, the second opening portion having a pattern shape corresponding to a pattern shape of the first opening portion, and being surrounded by a stack film formed of a halftone film on the transparent substrate and an opaque film on the halftone film, and radiating a charged beam onto a first region which includes an edge of the second opening portion and inside and outside regions which are respectively located inward and outward of the edge of the second opening portion, to etch that part of the transparent substrate which corresponds to the inside region.

9 Claims, 5 Drawing Sheets

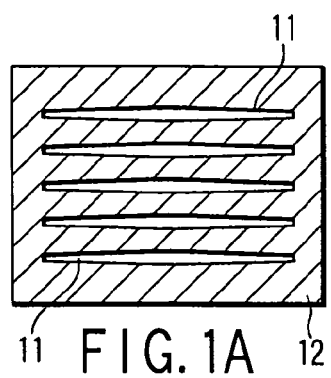 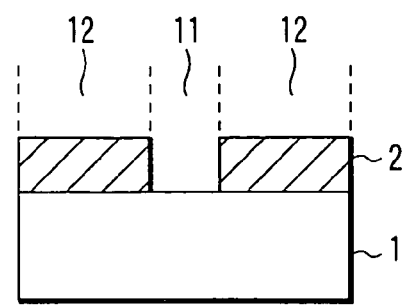
FIG. 1A    FIG. 1B
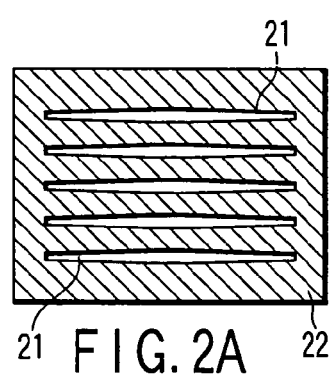 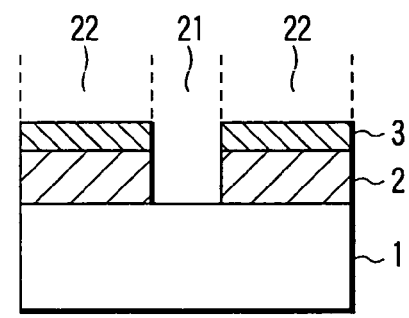
FIG. 2A    FIG. 2B
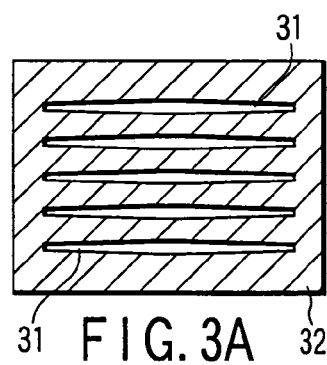 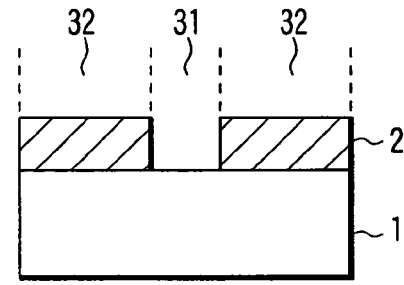
FIG. 3A    FIG. 3B
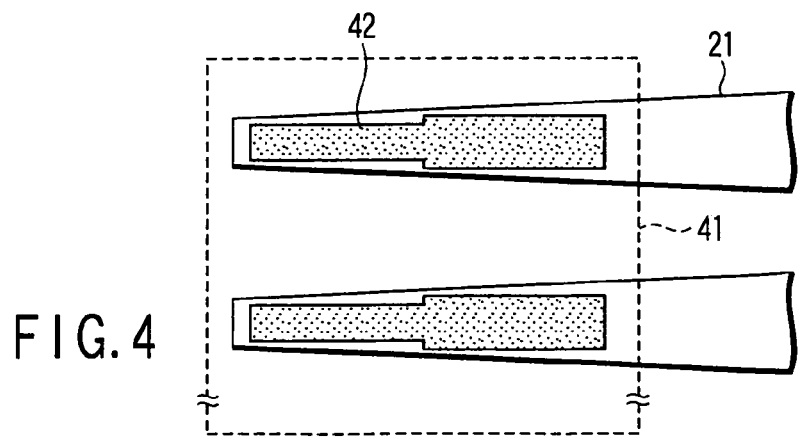
FIG. 4

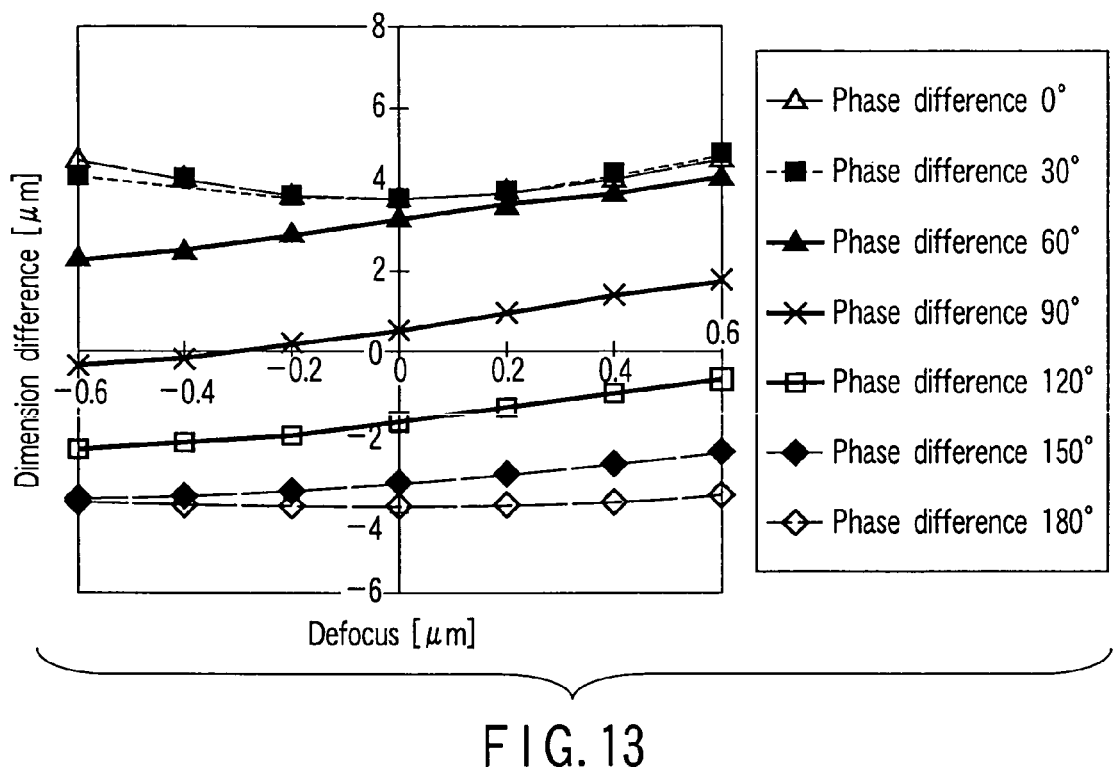
F I G. 13
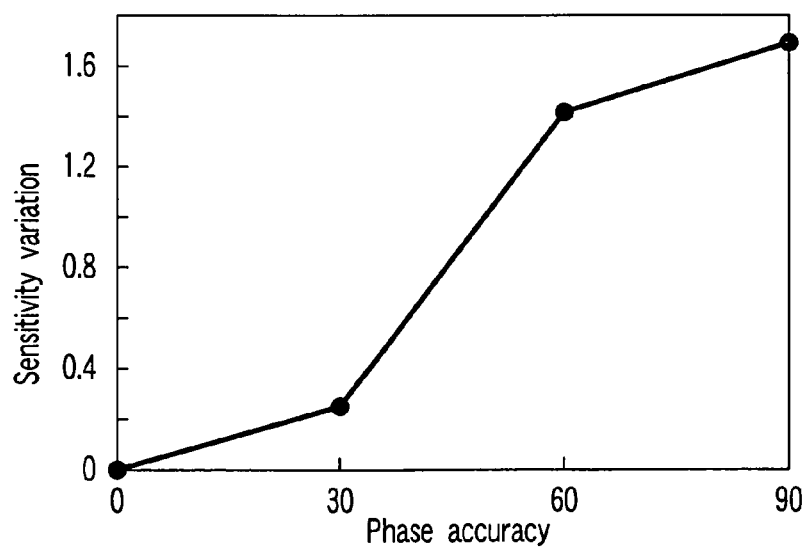
F I G. 14

METHOD FOR MANUFACTURING MASK FOR FOCUS MONITORING, AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2003-122339, filed Apr. 25, 2003, the entire contents of which are incorporated herein by reference.

BACKGROUND OF THE INVENTION

1. Field of the Invention

The present invention relates to a method for manufacturing a mask for focus monitoring, and also a method for manufacturing a semiconductor device.

2. Description of the Related Art

The importance of a focus monitoring technique in lithography has increased now that semiconductor devices have been so minute.

As the focus monitoring technique, e.g., Jpn. Pat. Appln. KOKAI Publication No. 2001-100392 proposes the following method: a reference monitoring mark and another monitoring mark having a pattern shape corresponding to that of the reference monitoring mark are formed on a photomask, and after transferring (projecting) those monitoring marks to a wafer, the direction and amount of defocus are determined based on the difference in dimension between the monitoring marks transferred to the wafer. For example, the reference monitoring mark is set such that the phase difference between exposure light passing through an opening portion of the reference monitoring mark and exposure light passing through a surrounding portion surrounding the opening portion is 180°, and the other monitoring mark is set such that the phase difference between exposure light passing through an opening portion of the other monitoring mark and exposure light passing through a surrounding portion surrounding the opening portion is 90°. When those two kinds of monitoring marks are transferred to the wafer, they satisfy a relationship in which the difference in dimension between the marks or the ratio between their dimensions is proportional to a defocus amount. The above relationship can be predetermined and stored as data. Therefore, the direction and amount of defocus can be obtained by actually performing exposure to measure the dimension difference or dimension ratio.

As the method for setting the phase difference of the above other monitoring mark at 90°, there are provided a method for etching part of a quartz substrate (transparent substrate) which corresponds to the opening portion and a method for etching part of a halftone film (phase shift film) which corresponds to the surrounding portion. These methods both use an FIB (Focused Ion Beam) apparatus.

However, it should be noted that the number of directions in which the FIB apparatus can scan a beam is only two. To be more specific, it can scan the beam in horizontal and vertical directions only. It is therefore extremely difficult to process the quartz substrate or the halftone film by using the FIB apparatus in accordance with the pattern shape of the monitoring mark, since the monitoring mark is shaped to include part in which an edge of an opening portion extends in oblique directions, like a wedge or rhombus. In order to improve the accuracy of the processing, it is necessary to increase a processing amplification to shorten the pitch of scanning of the beam or reduce the diameter of the beam. However, if such a method is applied, it inevitably takes long time to perform the processing.

In such a manner, it is impossible for a conventional method to form a monitoring mark with a high precision for a short time period by using a charged beam such as an ion beam.

BRIEF SUMMARY OF THE INVENTION

A method for manufacturing a mask for focus monitoring, according the first aspect of the present invention, comprises: forming a first opening portion and a second opening portion in a surface region of a transparent substrate, the second opening portion having a pattern shape corresponding to a pattern shape of the first opening portion, and being surrounded by a stack film formed of a halftone film on the transparent substrate and an opaque film on the halftone film; and radiating a charged beam onto a first region which includes an edge of the second opening portion and inside and outside regions which are respectively located inward and outward of the edge of the second opening portion, to etch that part of the transparent substrate which corresponds to the inside region.

A method for manufacturing a mask for focus monitoring, according to the second aspect of the present invention, comprises: forming a first opening portion and a second opening portion in a surface region of a transparent substrate, the second opening portion having a pattern shape corresponding to a pattern shape of the first opening portion, and being surrounded by a halftone film on the transparent substrate; and radiating a charged beam onto a first region which includes an edge of the second opening portion and inside and outside regions which are respectively located inward and outward of the edge of the second opening portion, to etch and thin that part of the halftone film which corresponds to the outside region.

BRIEF DESCRIPTION OF THE SEVERAL VIEWS OF THE DRAWING

FIGS. 1A and 1B are views for use in explaining a method for manufacturing a mask for focus monitoring, according to the first embodiment of the present invention.

FIGS. 2A and 2B are views for use in explaining the method according to the first embodiment of the present invention.

FIGS. 3A and 3B are views for use in explaining the method according to the first embodiment of the present invention.

FIG. 4 is a view for use in explaining the method according to the first embodiment of the present invention.

FIG. 13 is a view showing relationships between defocus amounts and the differences in dimension.

FIG. 14 is a view showing a relationship between a phase accuracy and sensitivity variation.

DETAILED DESCRIPTION OF THE INVENTION

Figure 5:
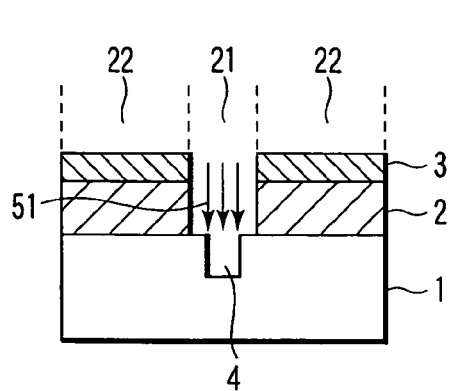
FIG. 5 is a view for use in explaining the method according to the first embodiment of the present invention.

The embodiments of the present invention will be explained with reference to the accompanying drawings.

First Embodiment

The method for manufacturing a mask for focus monitoring, according to the first embodiment, will be explained.

First, as shown in FIGS. 1A, 1B to 3A, 3B, three kinds of patterns for focus monitoring are formed by processing a substrate for photomask, where an MoSi film (a halftone film or phase shift film) 2 and a Cr film (opaque film) 3 are formed on a quartz substrate (transparent substrate) 1. FIGS. 1A, 2A and 3A are plan views. FIGS. 1B, 2B and 3B are cross-sectional views.

FIGS. 1A and 1B are views for schematically showing the structure of a reference region. As shown in the figures, the reference region includes five rhombic opening portions (opening pattern) 11 surrounded by a surrounding portion 12 containing the halftone film 2. The difference between the phase of exposure light passing through the opening portions 11 and that of exposure light passing through the surrounding portion 12 is 180°.

FIGS. 2A and 2B schematically show a region which will hereinafter be referred to as a negative phase shift region in order to simplify the explanation. The negative phase shift region includes five opening portions 21 surrounded by a surrounding portion 22 containing the halftone film 2 and the transparent film 3. The pattern of the opening portions 21 corresponds to that of the opening portions 11 of the reference region. In the negative phase shift region, the transparent substrate 1 is etched in a step carried out later. Thus, the phase of exposure light passing through the surrounding portion 22 is obtained by subtracting 90° from the phase of exposure light passing through the opening portion 21.

FIGS. 3A and 3B schematically show a region which will be hereinafter referred to as a positive phase shift region in order to simplify the explanation. The positive phase shift region includes five opening portions 31 surrounded by a surrounding portion 32 containing the halftone film 2. The pattern of the opening portions 31 corresponds to that of the opening portions 11 of the reference region. In the positive phase shift region, the halftone film 2 is etched and thinned in a step carried out later. Thus, the phase of exposure light passing through the surrounding portion 32 is obtained by adding 90° to the phase of exposure light passing through the opening portion 31.

Only one of the monitoring pattern shown in FIGS. 2A and 2B and that in FIGS. 3A and 3B may be provided. However, when both the monitoring patterns are provided, the sensitivity for focus monitoring is double that in the case where only one of the above two monitoring patterns is used. This is because the two monitoring patterns have opposite characteristics after being subjected to processing which will be described later.

An example of processing will be explained. In the following explanation, suppose a KrF excimer laser for emitting a laser beam having a wavelength of 248 nm is used as a light source for emitting exposure light in a photolithography step.

First, a substrate where an MoSi film and a Cr film are successively formed is prepared. The MoSi film has a thickness of 100 nm, and the Cr film has a thickness of 59 nm. Then, the substrate is coated with resist, and is subjected to EB (electron beam) writing, development and etching. Furthermore, the substrate is further coated with resist, and subjected to writing, development and etching in order that part of the Cr film be kept located in a frame portion. In this case, the Cr films in the reference region and the positive phase shift region are etched away, and the Cr film in the negative phase shift region is not etched. As a result, such three kinds of patterns as shown in FIGS. 1A, 1B to 3A, 3B are obtained. These patterns for focus monitoring are formed in a region, e.g., a dicing region, which is located outward of an element formation region.

Thereafter, while a defect correcting step is being carried out, additional processing is performed on the focus monitoring pattern shown in FIGS. 2A and 2B and that shown in FIGS. 3A and 3B. Thus, the focus monitoring patterns can be subjected to the additional processing without changing the order of steps in an ordinary method of manufacturing a mask. The additional processing for the pattern shown in FIGS. 2A and 2B and that for the pattern in FIGS. 3A and 3B will be explained.

First, the additional processing for the pattern in FIGS. 2A and 2B, i.e., processing for etching part of the transparent substrate 1 which corresponds to the opening portions 21, will be explained with reference to FIGS. 4; 5; 6; 7A and 7B.

First, as shown in FIG. 4, regions located inward of edges of the opening portions 21 and separated from edges of the opening portions 21 are set as beam irradiation regions 42. Then, as shown in FIG. 5, a Ga ion beam (charged beam) 51 is radiated onto the beam irradiation regions 42. Thereby, parts of the transparent substrate 1 which correspond to the beam irradiation regions 42 are etched, thereby forming holes 4.

Figure 6:
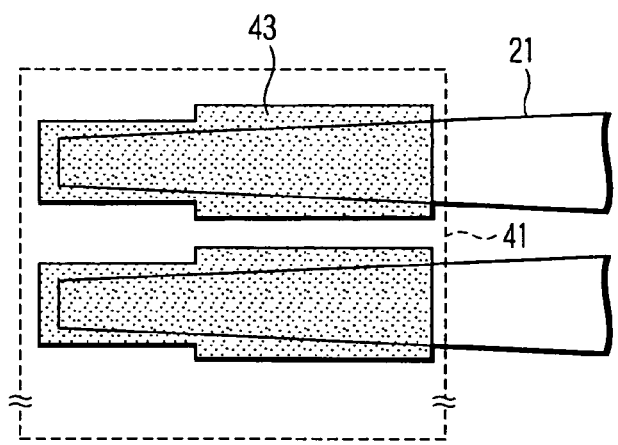
FIG. 6 is a view for use in explaining the method according to the first embodiment of the present invention.
Figure 7A:
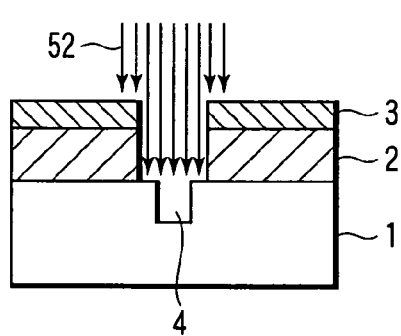
FIGS. 7A and 7B are views for use in explaining the method according to the first embodiment of the present invention.
Figure 7B:
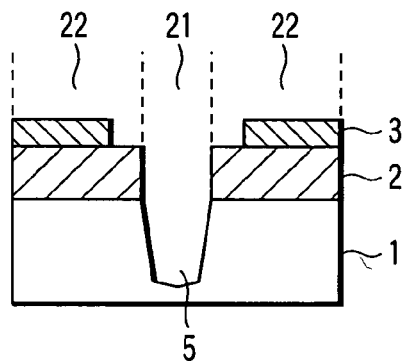

Next, as shown in FIG. 6, regions covering the edges of the opening portions 21 (i.e., regions which include the edges and regions located respectively inward and outward of the edges as shown in the figure) are set as beam irradiation regions 43. That is, the width of each of the beam irradiation regions 43 is greater than that of each of the opening portions 21. To be more specific, the width of each beam irradiation region 43 is determined by adding, to the width of each opening portion 21, a width by which a phase effect of the halftone film can be obtained. Then, as shown in FIG. 7A, a Ga ion beam 52 is radiated onto the beam irradiation regions 43. Thereby, as shown in FIG. 7B, parts of the transparent substrate 1 which correspond to the opening portions 21 are etched, and part of the opaque film 3 which surrounds the opening portions 21 are etched. As a result, holes 5 corresponding to the opening portions 21 are formed, and parts of the halftone film 2 which surround the opening portions 21 are exposed. The depth of each of the holes 5 is 90° when it is converted into the phase of the exposure light.

Etching using the Ga ion beam is carried out mainly by a physical sputtering. It has been confirmed from an experimental result that the etching rate of the quartz substrate 1 is higher than that of the Cr film 3. Accordingly, the Cr film 3 effectively functions as a mask for the halftone film 2. Further, the etching rate of a part of the quartz substrate 1 which corresponds to the side of the hole is higher than that of a part of the quartz substrate 1 which corresponds to the bottom of the hole. Thus, side etching is performed at a higher speed. For these reasons, the holes 5 can be formed such that their side surfaces are aligned with the opening portions 21, and their bottoms are flat to some degree, as shown in FIG. 7B. Although it is difficult to completely flatten the bottoms of the holes 5, it is not considered that this greatly influences focus monitoring.

It is necessary that the depth of each of the holes 5 is set at a predetermined value, in order that the phase difference between exposure light passing through the opening portions 21 and exposure light passing through the surrounding portion 22 be 90°. Also, in the second etching step disclosed in FIGS. 6, 7A and 7B, it is necessary to end etching when the surface of the halftone film 2 is exposed, in order to maintain the thickness of the halftone film 2. In the first embodiment, in the first etching step disclosed in FIGS. 4 and 5, a Ga ion beam 51 is radiated only onto the beam irradiation regions 42 to etch the transparent substrate 1 only, thereby forming holes 4. Thus, if the depth of each of the holes 4 is optimized, the depth of each of the holes 5 can be set at a predetermined value when the surface of the halftone film 2 is exposed.

In such a manner, in the first embodiment, the opaque film 3 is used as a mask for the halftone film 2 in the second etching step. Thus, the edge of each opening portion can be reliably appropriately shaped to extend obliquely, even by using an apparatus which can scan a beam in only two directions, i.e., horizontal and vertical directions, as in an FIB apparatus. Furthermore, in the first etching step, holes 4 are formed in the opening portions 21 in advance, as a result of which in the second etching step, the holes 5 can be each formed to have a predetermined depth, without substantially etching the halftone film 2. Therefore, monitoring marks can be formed with a high precision for a short time period.

An example of processing will be explained.

First, the first etching shown in FIGS. 4 and 5 will be explained. As an FIB mask repair apparatus, "SIR3000X" made by Seiko Instruments, Inc. can be used.

As shown in FIG. 4, the position of a stage is adjusted such that a distal end region of each opening portion 21 which is substantially one third the area of each opening portion 21 is within an observation region 41 which is 20 μm square. The observation region is an imaginary region obtained by secondary electrons or secondary ions which are generated when an ion beam is scanned before the processing. A radiation area template which is of a so-called G-Copy type is used as a template for defining the beam irradiation region 42. The template to be used has the largest possible size under a condition wherein it can be completely located within the edge of the opening portion 21. In the first embodiment, the width of the template is set such that part of the template which is close to the distal end of the opening portion 21 (i.e., which is relatively narrow) has a width equal to the total width of 4 pixels, and part of the template which is far from the distal end of the opening portion 21 (i.e., which is relatively wide) has a width equal to the total width of 6 pixels. It should be noted that when the observation region is 20 μm square, 1 pixel is 62.5 nm square. Although only two templates are depicted in FIG. 4, actually, five templates are all located within the observation region 41 which is 20 μm square. In the processing, since an ion beam is radiated onto a position located apart from the edge of the opening portion 21, a problem does not arise even when a amplification is low (i.e., the field of the view is 20 μm square) and the precision of alignment is low.

Then, a Ga ion beam is radiated onto a template region, under a condition in which an intermediate aperture is open, 65 pA of probe current flows, a beam residence time is 200 μseconds/pixel, and an acceleration voltage is 20 kV, thereby forming holes 5 as shown in FIG. 5. Suppose the depth of each of the holes 4 is 60 nm. The depth of each hole 4 is proportional to the exposure dose of a radiated beam, and the exposure dose of the beam which is required for obtaining holes 4 each having a depth of 60 nm is 110 CST (1 CST=$1.6 \times 10^{13}$ ions/cm$^2$).

It will be explained why the depth of each hole 4 is set at 60 nm.

It is known as experimental knowledge that in the case of using a KrF excimer laser for emitting a laser beam having a wavelength of 248 nm as exposure light, the final requisite depth of each hole is approximately 137 nm in order to obtain the phase difference of 90°. The final requisite depth of each hole is approximately 122 nm, in the case where processing is performed by using an ordinary quartz etcher or the like. However, since the refractive index of the quartz substrate 1 becomes higher by Ga ions injected into the substrate 1, the depth of each hole is set to be greater than 122 nm. In the processing, the depth of each hole 4 is set at 60 nm, whereby the final requisite depth of each hole, i.e., the depth of each hole 5 shown in FIG. 7B, can be set at 137 nm.

Next, the second etching step shown in FIGS. 6, 7A and 7B will be explained.

In the second etching step, as shown in FIG. 6, the position of the stage is adjusted such that the distal end region of each opening portion 21 which is substantially one third the area of each opening portion 21 is within the observation region 41 which is 20 μm square, as well as in the first etching step. The width of a template for defining each of the beam irradiation regions 43 is greater than the width of each opening portion 21. In the first embodiment, the template to be used covers the edge of each opening portion 21 and a region having a width of 0.5 μm which is located outward of the edge of each opening portion 21. Next, a Ga ion beam is radiated under a condition which is the same as the condition under which a Ga ion beam is radiated for the first time, thereby forming holes 5 as shown in FIG. 7B. As described above, suppose the holes each have a depth of 137 nm, and the exposure dose of the Ga ion beam is 135 CST.

The transmissivity of the quartz substrate 1 lowers since Ga ions are injected into the substrate 1. Thus, the exposure dose which is required for resolution varies. In order to avoid this problem, it is necessary to radiate an ion beam in a XeF$_2$ atmosphere or an atmosphere of a halogen gas such as iodine, with slight part of the Cr film remaining. This can prevent lowering of the transmittivity of the quartz substrate 1, which is caused by Ga.

The explanation of the above example is made on the supposition that the exposure light has a wavelength of 248 nm. If the exposure light has a wavelength of 193 nm, the depth of each hole 5 may be approximately 95 nm. Therefore, in the first etching step, the exposure dose of the Ga ion beam may be approximately 50 CST.

Next, the additional processing for the pattern shown in FIGS. 3A and 3B, i.e., processing for etching and thinning part of the halftone film 2 which surrounds the opening portions 31, will be explained with reference to FIGS. 8, 9A and 9B.

Figure 8:
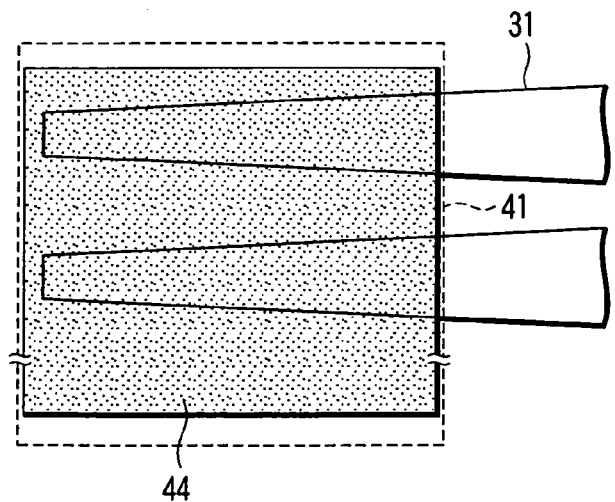
FIG. 8 is a view for use in explaining the method according to the first embodiment of the present invention.

First, as shown in FIG. 8, a beam irradiation region 44 is set to cover the edge regions of the opening portions 31 (i.e., to include the edges of the opening portions 31 and regions respectively located inward and outward of the edges). Then, as shown in FIG. 9A, a Ga ion beam 53 is radiated onto the beam irradiation region 44 in a predetermined gas atmosphere (e.g., an iodine gas atmosphere) which lowers the ratio of an etching rate of the transparent substrate 1 to that of the halftone film 2. Thereby, as shown in FIG. 9B, the part of the halftone film 2 which surrounds the opening portions 31 is selectively etched and thinned, with the transparent substrate 1 only slightly etched. The thickness of part of the halftone film 2 which is removed by etching is 90° when being converted into the phase of exposure light.

The thickness of the halftone film 2 needs to be decreased to a predetermined value (e.g., a thickness half the thickness of the halftone film 2 which is measured when it is not yet subjected to etching), with the transparent substrate only slightly etched, in order that the phase difference between exposure light passing through the opening portions 31 and exposure light passing through a surrounding region 32 be 90°. In the first embodiment, an ion beam is radiated in the above predetermined gas atmosphere. Thus, although the beam irradiation region 44 is set to cover the edge regions of the opening portions 31 as shown in FIG. 8, the thickness of the halftone film 2 can be decreased to a predetermined value, with the transparent substrate 1 only slightly etched. Therefore, monitoring marks can be formed with a high precision for a short time period, even by using an apparatus which can scan a beam in only two directions, i.e., horizontal and vertical directions, as in an FIB apparatus.

An example of processing will be explained.

As shown in FIG. 8, the position of the stage is adjusted such that a distal end region of each opening portion 31 which is substantially one third the area of each opening portion 31 is within the observation region 41 which is 20 μm square, as in the above etching step of the quartz substrate. Furthermore, the beam irradiation region 44 is set.

Figure 9A:
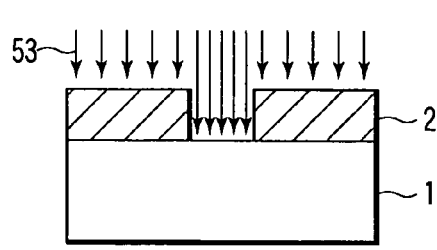
FIGS. 9A and 9B are views for use in explaining the method according to the first embodiment of the present invention.

Next, as shown in FIG. 9A, an iodine gas is introduced into a processing chamber, and the internal pressure of the processing chamber is set at $2 \times 10^{-3}$ Pa. Then, a Ga ion beam is radiated onto the beam irradiation region 44 under a condition in which an intermediate aperture is open, 65 pA of probe current flows, a beam residence time is 5 μseconds/pixel, an acceleration voltage is 20 kV, and the exposure dose is 20 CST. Due to a gas assist etching using an iodine gas, the etching rate of the quartz substrate 1 remarkably lowers, and only the MoSi film 2 is selectively etched. In this case, the beam may be defocused by varying the voltage of an objective lens, in order to enhance a gas assist effect.

Figure 9B:
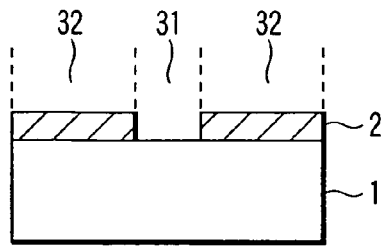

In such manner, as shown in FIG. 9B, the MoSi film 2 is selectively etched, with the quartz substrate 1 only slightly etched. As a result, the thickness of the MoSi film 2 is decreased to a value (50 nm) which is half the thickness (100 nm) of the MoSi film 2 which is measured when it is not subjected to etching. It should be noted that the transmittivity of the quartz substrate 1 was approximately 50%, that of the MoSi film 2 was approximately 20%, and the side etching width of the opening portion 31 was approximately 40 nm, when they are measured after etching was carried out.

The explanation of the above example is made on the supposition that exposure light has a wavelength of 248 nm. However, when the exposure light has a wavelength of 193 nm, the exposure dose of the Ga ion beam is decreased to approximately 16 CST, since the thickness of the MoSi film is small.

Focus monitoring marks obtained through the above processing are transferred to a wafer, while varying the focus position. The lengths of the transferred marks are measured in their longitudinal directions. The differences between the dimensions of the marks are stored as data in association with the variation of the focus position. Thus, based on the data, the focus position can be specified when a device pattern is actually transferred to a wafer.

Second Embodiment

The method for manufacturing a mask for focus monitoring, according to the second embodiment, will be explained.

In the second embodiment, the additional processing for the pattern shown in FIGS. 2A and 2B in the first embodiment, i.e., processing for etching parts of the transparent substrate 1 which correspond to the opening portions 21, is changed. To be more specific, in the first embodiment, first and second etching (Ga ion radiation) steps are carried out to form holes 5 each having a predetermined depth. In the second embodiment, formation of holes 5 each having a predetermined depth is achieved by a single etching step. The second embodiment will be explained with reference to FIGS. 10A, 10B and 11.

Figure 10A:
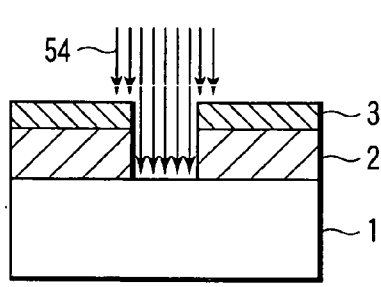
FIGS. 10A and 10B are views for use in explaining a method for manufacturing a mask for focus monitoring, according to the second embodiment of the present invention.
Figure 10B:
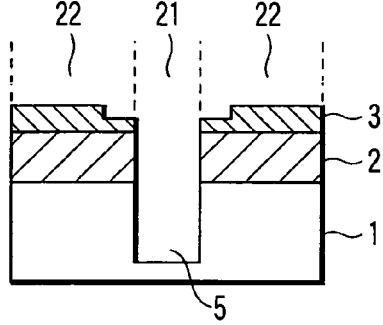

As shown in FIG. 10A, a Ga ion beam 54 is radiated to a region including the edges of the opening portions 21 and regions respectively located inward and outward of the edges. At this time, a beam irradiation region is set in the same manner as in the case shown in FIG. 6 with respect to the first embodiment. In the second embodiment, a Ga ion beam 54 is radiated onto a beam irradiation region 44 (see FIG. 6) in a predetermined gas atmosphere (e.g., an $XeF_2$ gas atmosphere) which can increase the ratio (selective ratio) of the etching rate of the transparent substrate (quartz substrate) 1 to that of the opaque film (Cr film) 3. Thereby, as shown in FIG. 10B, parts of the transparent substrate 1 which correspond to the opening portions 21 are etched, and part of the opaque film 3 which surround the opening portions 21 is also etched. As a result, holes 5 corresponding to the opening portions 21 are formed, and the above part of the opaque film 3 is thinned. The depth of each of the holes 5 is 90° when being converted into the phase of exposure light.

If the above gas is not used, the above selective ratio cannot be increased, since etching of a Ga ion beam has a physical effect as its main effect. That is, the selective ratio can be increased by radiation of an Ga ion beam in the $XeF_2$ gas atmosphere. Thus, the opaque film (Cr film) 3 can reliably function as a mask for the halftone film (MoSi film) 2. As a result, the holes 5 can be formed to have a predetermined depth by a single etching step.

To be more specific, in order that holes 5 each having a predetermined depth be formed by the single etching step, it is necessary that the above selective ratio is approximately 2.06 or more when exposure light having a wavelength of 248 nm is radiated, and the selective ratio is approximately 1.46 or more when exposure light having a wavelength of 193 nm is radiated.

Figure 11:
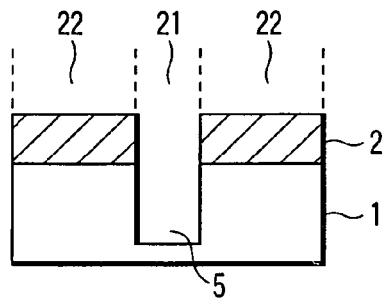
FIG. 11 is a view for use in explaining the method according to the second embodiment of the present invention.

Then, as shown in FIG. 11, the opaque film 3 is etched to expose the surface of part of the halftone film 2 which surround the opening portions 21. To be more specific, a region other than a region including the focus monitoring marks is covered with a resist pattern, and part of the opaque film 3 which corresponds to a region including the focus monitoring marks, is selectively removed by wet etching. For exposure of the resist pattern, a simple exposure apparatus such as a laser repair apparatus may be used.

In such a manner, in the second embodiment, a Ga ion beam is radiated in a predetermined gas atmosphere, thereby enabling the opaque film to reliably function as a mask for the halftone film. Therefore, holes can be formed to have a predetermined depth by a single etching step. Thus, the edge of each opening portion can be reliably appropriately formed to extend obliquely, even by using an apparatus which can scan a beam in only two directions, i.e., horizontal and vertical directions, as in an FIB apparatus. Therefore, focus monitoring marks can be formed with a high precision for a short time period.

Figure 12A:
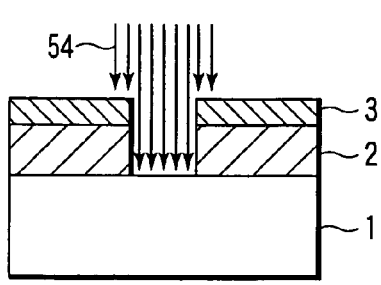
FIGS. 12A and 12 are views for use in explaining the method according to a modification of the second embodiment of the present invention.
Figure 12B:
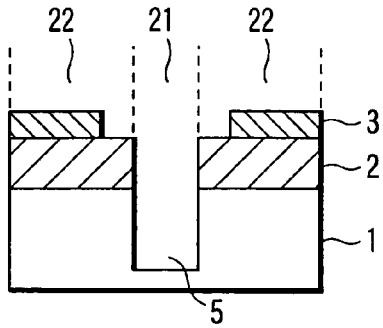

Also, the selective ratio can be set at an appropriate value by using an appropriate gas or adjusting the gas atmosphere. Furthermore, as described later, focus monitoring can be carried out even if the phase difference is not 90°, and thus the final requisite depths of the holes 5 can be changed. In those cases, the surface of the halftone film 2 can be exposed as shown in FIGS. 12A and 12B when the depth of each hole 5 reaches a predetermined value. Therefore, an etching step of the opaque film 3 which is shown in FIG. 11 can be omitted, thus simplifying the manufacturing process.

The first and second embodiments can be modified as follows:

In the first and second embodiment, as explained above, the phase difference between exposure light passing through the opening portions and that passing through the surrounding portion is 90°. However, it is not limited to 90°.

FIG. 13 is a view showing relationships between defocus amounts and differences in dimension between focus monitoring marks, which are obtained when the above phase difference is changed. As can be seen from FIG. 13, lines respectively obtained when the phase difference is 60°, 90° and 120° vary in substantially the same manner. FIG. 14 is a view showing a phase accuracy and sensitivity variation (corresponding to the amount of lowering of the sensitivity) when the phase difference is 90°. In the figure, the horizontal axis indicates a phase error amount measured when the phase difference is 90°, and the vertical axis indicates the sensitivity variation. As can be seen from the figure, the phase accuracy exceeds 30°, the sensitivity variation rapidly increases. Accordingly, it suffices that the phase difference falls within the range of 60° to 120°.

Moreover, in the first and second embodiments, the rhombic focusing monitoring marks are used; however, wedgy focusing monitoring marks may be used. In general, a pattern wherein a pattern width of at least part of the opening portion gradually decreases in one direction can be used as a focusing monitoring mark.

Furthermore, the above explanations of the first and second embodiments do not refer to the relationship in size between three kinds of monitoring marks. However, since the exposure doses of the marks are equalized, it is preferable that the following relationship between the marks be established:

It is preferable that the sizes of the opening portions 21 for the negative phase shift be greater than those of the opening portions 11 for the reference. As stated above, the transmitivity of the transparent substrate 1 is lowered by radiation of a Ga ion beam thereonto, thus also lowering the exposure dose. However, the exposure dose can be increased by increasing the sizes of the opening portions 21. It is also preferable that the sizes of the opening portions 31 for the positive phase shift be smaller than those of the opening portions 11 for the reference. In the positive phase shift region, the exposure dose is increased since part of the halftone film which surrounds the opening portions 31 is etched. However, the exposure dose can be lowered by decreasing the sizes of the opening portions 31.

It is ideal that focus monitoring does not depend on the exposure dose at the exposure, and the dimensions of focus monitoring marks are determined only based on the focus position. However, actually, there is a case wherein focus monitoring is influenced by the exposure dose. In this case, such an influence can be restricted by grasping the exposure dose by using a pattern for monitoring the dose, in addition to the focus monitoring patterns.

Third Embodiment

Figure 15:
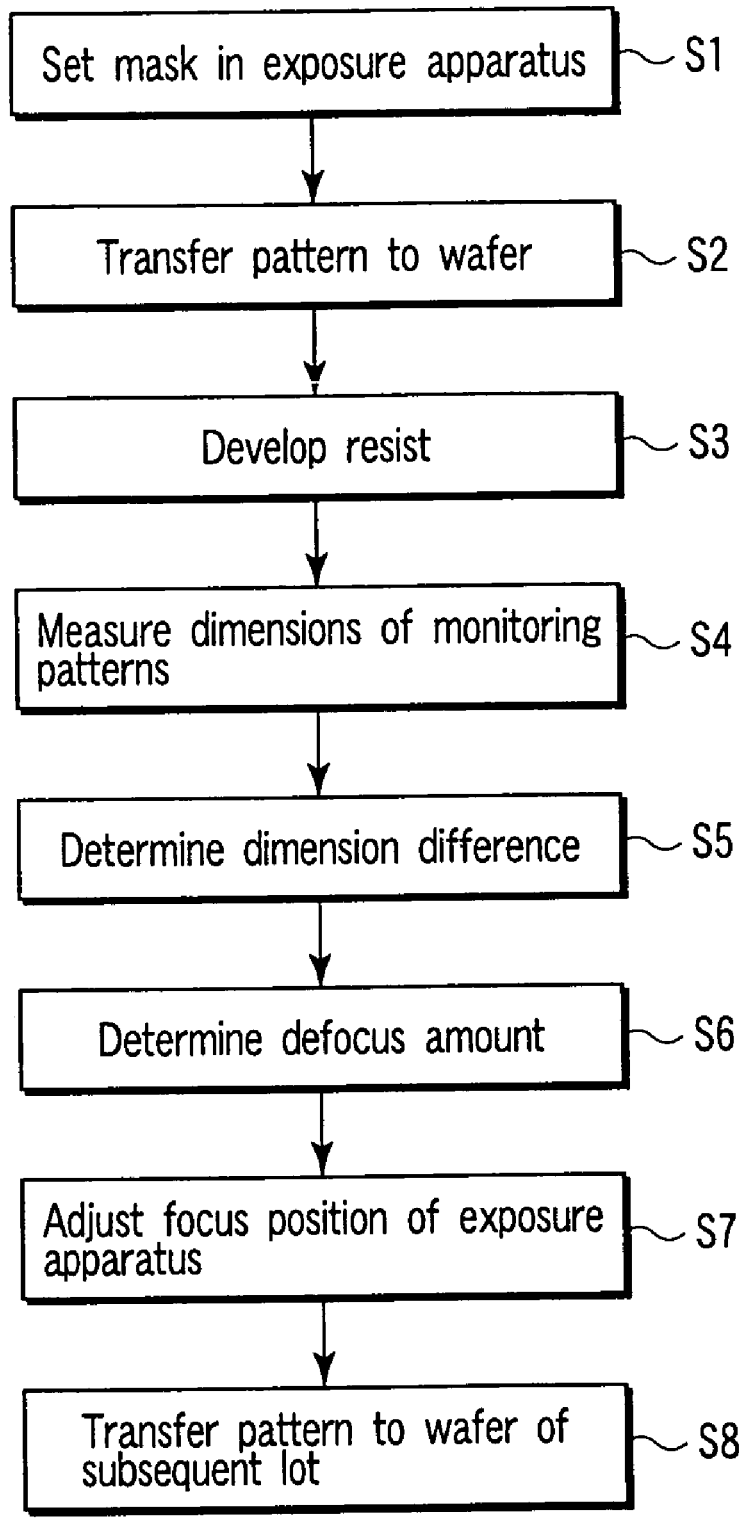
FIG. 15 is a flowchart of steps which are carried out, when the method for manufacturing the mask, according to each of the first and second embodiments of the present invention, is applied to manufacturing of a semiconductor device.

The third embodiment relates to a method for manufacturing a semiconductor device by using such a mask as described above with reference to the first and second embodiments. The third embodiment will be explained with reference to FIG. 15.

In the third embodiment, the processing will be carried out in the following order: a mask is set in an exposure apparatus (S1); exposure processing is carried out by using the set mask to transfer a pattern onto resist on a wafer (semiconductor substrate) (S2); developing processing of the resist is carried out (S3); with respect to a resist pattern obtained by the developing processing, the dimensions of focus monitoring marks are measured (S4), and the differences between those dimensions are determined (S5), i.e., with respect to the above obtained resist pattern, the difference in dimension between the focus monitoring mark formed in the reference region and that formed in the negative phase shift region, the difference in dimension between the focus monitoring mark formed in the reference region and that formed in the positive phase shift region, or the difference in dimension between the focus monitoring mark formed in the positive phase shift region and that in the negative phase shift region, is determined; and a defocus amount corresponding to the determined difference is determined on the basis of a calibration curve which is determined in advance (S6).

The above processing is performed on a predetermined number of wafers of a given lot, thereby obtaining respective defocus amounts, and the average value of the obtained defocus amounts is determined as the defocus amount of the above lot. Then, the focus position of the exposure apparatus is adjusted on the basis of the above average value of the defocus amount (S7). Thereafter, patterns are transferred to wafers of a subsequent lot by the exposure apparatus the focus position of which is adjusted, by using the above mask (S8).

The above processing is performed on each of the lots in the above manner. Thus, each wafer in each lot can be processed in its optimal focus position, thereby improving the yield of semiconductor devices, and also characteristics thereof.

Additional advantage and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a mask for focus monitoring, comprising:

forming a first opening portion and a second opening portion in a surface region of a transparent substrate, the second opening portion having a pattern shape corresponding to a pattern shape of the first opening portion, and being surrounded by a stack film formed of a halftone film on the transparent substrate and an opaque film on the halftone film; and radiating a charged beam onto a first region which includes an edge of the second opening portion and inside and outside regions which are respectively located inward and outward of the edge of the second opening portion, to etch that part of the transparent substrate which corresponds to said inside region.

2. The method according to claim 1, further comprising radiating a charged beam onto a second region to etch that part of the transparent substrate which corresponds to the second region, before radiating the charged beam onto the first region, the second region being located inward of the edge of the second opening portion and separated from the edge of the second opening portion.

3. The method according to claim 1, wherein radiating the charged beam onto the first region includes etching that part of the opaque film which corresponds to said outside region to expose that part of the halftone film which corresponds to said outside region.

4. The method according to claim 3, wherein a phase difference between exposure light passing through said inside region and exposure light passing through said outside region falls within a range of 60° to 120°, after radiating the charged beam onto the first region.

5. The method according to claim 1, further comprising etching that part of the opaque film which corresponds to said outside region to expose that part of the halftone film which corresponds to said outside region, after radiating the charged beam onto the first region.

6. The method according to claim 5, wherein a phase difference between exposure light passing through said inside region and exposure light passing through said outside region falls within a range of 60° to 120°, after etching that part of the opaque film which corresponds to said outside region.

7. The method according to claim 1, wherein radiating the charged beam onto the first region is carried out in a gas atmosphere which increases a ratio of an etching rate of the transparent substrate to an etching rate of the opaque film.

8. The method according to claim 1, wherein a size of the second opening portion is greater than a size of the first opening portion.

9. The method according to claim 1, wherein a width of at least part of the second opening portion decreases in one direction.

* * * * *